(12) United States Patent
Mitsuyuki et al.

(10) Patent No.: US 10,541,733 B1
(45) Date of Patent: Jan. 21, 2020

(54) REGULATED SWITCH BANKS FOR DRIVING TRANSMIT POWER AMPLIFIERS OF A MIMO WIRELESS TRANSCEIVER

(71) Applicant: Quantenna Communications, Inc., San Jose, CA (US)

(72) Inventors: Leonardo Mitsuyuki, Chandler, AZ (US); Kyle Zukowski, Scottsdale, AZ (US); Cristiano Benevento, Chandler, AZ (US); Didier Margairaz, San Jose, CA (US)

(73) Assignee: QUANTENNA COMMUNICATIONS, INC., San Jose, CA (US)

( * ) Notice: Subject to any disclaimer, the term of this patent is extended or adjusted under 35 U.S.C. 154(b) by 17 days.

(21) Appl. No.: 15/803,828

(22) Filed: Nov. 5, 2017

(51) Int. Cl.
*H04B 7/0426* (2017.01)
*H03F 3/189* (2006.01)
*G06F 1/10* (2006.01)

(52) U.S. Cl.
CPC ............. *H04B 7/0426* (2013.01); *G06F 1/10* (2013.01); *H03F 3/189* (2013.01)

(58) Field of Classification Search
USPC ...................................................... 375/295
See application file for complete search history.

(56) References Cited

U.S. PATENT DOCUMENTS

| | | | |
|---|---|---|---|
| 7,103,114 B1* | 9/2006 | Lapierre | H03F 1/0227 375/295 |
| 8,180,304 B2 | 5/2012 | Ma et al. | |
| 8,803,603 B2 | 8/2014 | Wimpenny | |
| 9,136,809 B2 | 9/2015 | McMorrow et al. | |
| 9,654,055 B2 | 5/2017 | Delepaut et al. | |
| 2004/0140845 A1* | 7/2004 | Eberlein | G05F 1/575 327/541 |
| 2013/0049858 A1* | 2/2013 | Wimpenny | H03F 1/0222 330/84 |
| 2017/0093341 A1* | 3/2017 | Poulin | H03F 1/0233 |

* cited by examiner

*Primary Examiner* — Wednel Cadeau
(74) *Attorney, Agent, or Firm* — Michael J. Scapin

(57) ABSTRACT

A wireless transceiver including: antennas, components forming transmit and receive chains coupled to the antennas for MIMO communications, voltage sources, power amplifier supply voltage detectors and regulated switches. The components forming the transmit chains include power amplifiers (PA)s each coupled to a corresponding one of the transmit chains for amplifying RF signals of a MIMO communication link and each PA having a supply voltage input. The PA supply voltage detectors each couple to an associated one of the transmit chains to detect changes in an amplitude of the signal thereon and to identify required changes in the supply voltage level of the corresponding PA for transmission of the signal. The regulated switches couple the voltage sources and PAs, and are responsive to each PA's supply voltage detector to switchably couple the supply voltage input of each PA to the voltage sources providing the identified voltage levels during transmission.

20 Claims, 6 Drawing Sheets

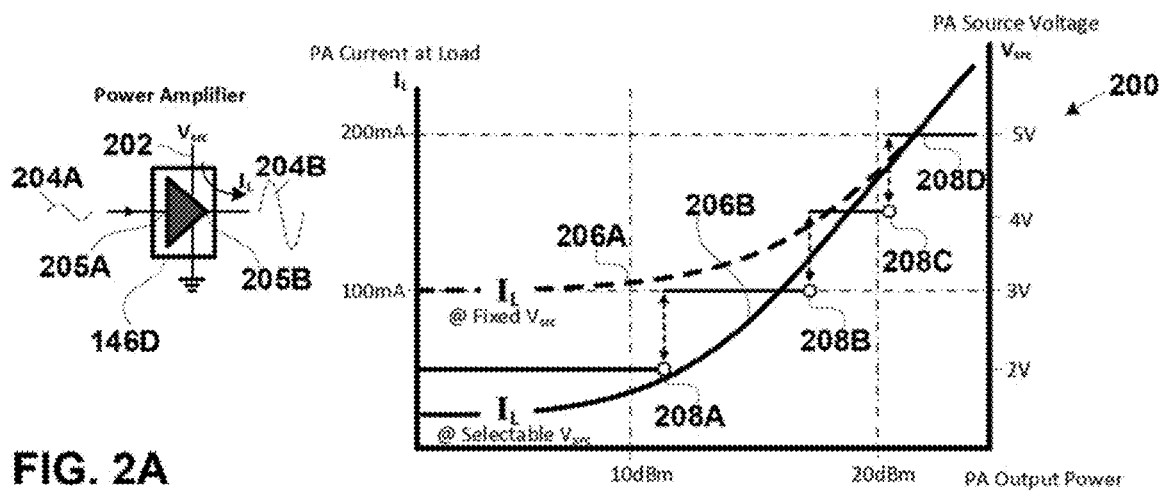
FIG. 2A
Voltage Source Breakpoints Conforms with PA Characteristics
FIG. 2B
FIG. 2C
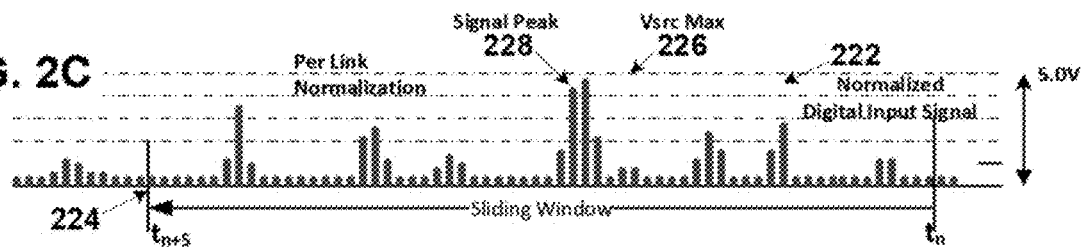
FIG. 2D
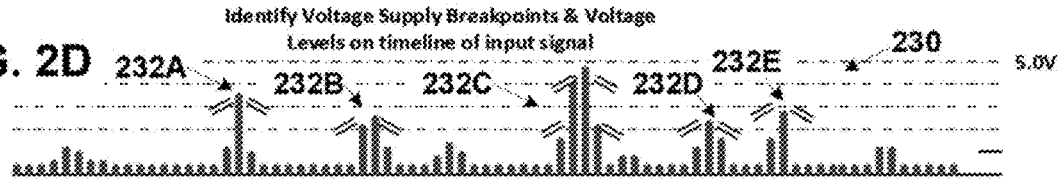
FIG. 2E
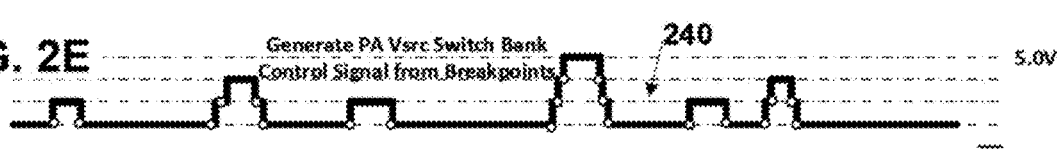
Digital Breakpoint Identification drives PA Supply Voltage Selection

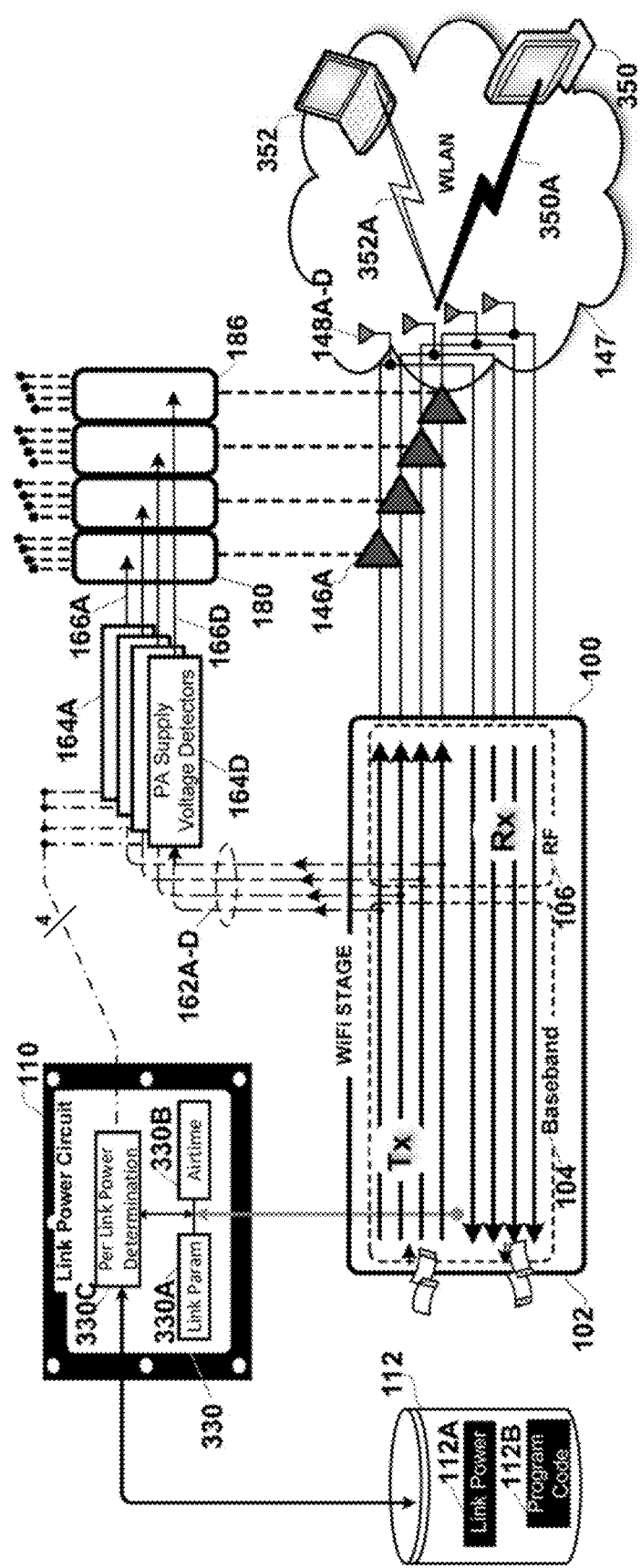
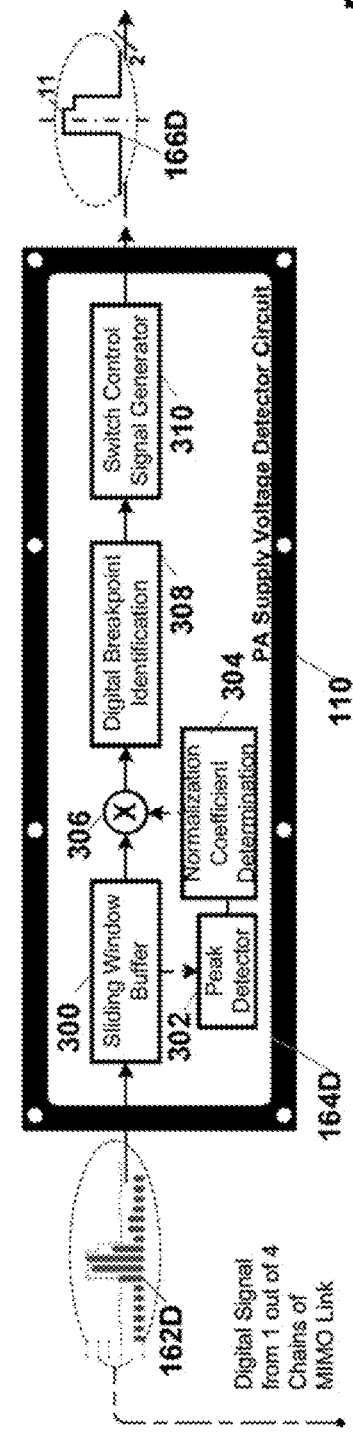
FIG. 3B
FIG. 3A

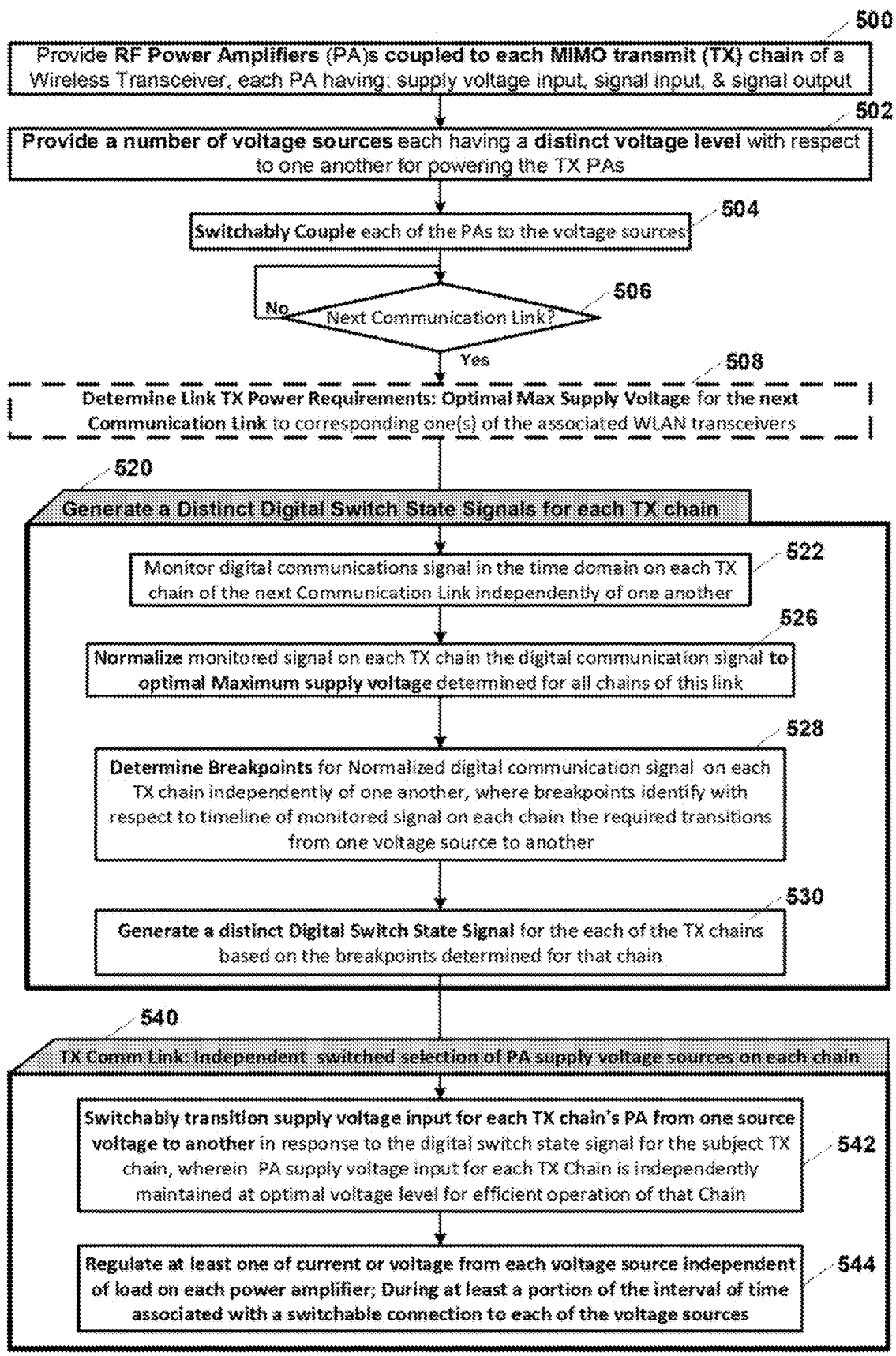
FIG. 5  Method for Driving MIMO Transmit Power Amplifiers

REGULATED SWITCH BANKS FOR DRIVING TRANSMIT POWER AMPLIFIERS OF A MIMO WIRELESS TRANSCEIVER

BACKGROUND OF THE INVENTION

1. Field of Invention

The field of the present invention relates in general to wireless transceivers and in particular to a driver for power amplifiers on the transmit chains of multiple-input multiple output (MIMO) wireless transceivers.

2. Description of the Related Art

Home and office networks, a.k.a. wireless focal area networks (WLAN) are established using a device called a Wireless Access Point (WAP). The WAP may include a router. The WAP wirelessly couples all the devices of the home network, e.g. wireless stations such as: computers, printers, televisions, digital video (DVD) players, security cameras and smoke detectors to one another and to the Cable or Subscriber Line through which Internet, video, and television is delivered to the home. Most WAPs implement the IEEE 802.11 standard which is a contention based standard for handling communications among multiple competing devices for a shared wireless communication medium on a selected one of a plurality of communication channels. The frequency range of each communication channel is specified in the corresponding one of the IEEE 802.11 protocols being implemented, e.g. "a", "b", "g", "n", "ac", "ad", "ax". Communications follow a hub and spoke model with a WAP at the hub and the spokes corresponding to the wireless links to each 'client' device.

Communications on the single communication medium are identified as "simplex" meaning, one communication stream from a single source node to one or more target nodes at one time, with all remaining nodes capable of "listening" to the subject transmission. Starting with the IEEE 802.11ac standard and specifically 'Wave 2' thereof, discrete communications to more than one target node at the same time may take place using what is called Multi-User (MU) multiple-input multiple-output (MiMO) capability of the WAP. MU capabilities were added to the Standard to enable the WAP to communicate with multiple single antenna single stream devices concurrently, thereby increasing the time available for discrete MIMO video links to wireless HDTVs, computers tablets and other high throughput wireless devices the communication capabilities of which rival those of the WAP.

With the adoption in the IEEE 802.11n standard of multiple-input multiple-output (MIMO) communications the communications throughput capacity on the existing spectrum was greatly enhanced. MIMO multiplies the capacity of a wireless, communication link using multipath propagation between multiple transmit and receive antennas, a.k.a. the MIMO antenna, arrays, on the WAP and the station on either end of a communication link.

Starting with the IEEE 802.11ac standard and specifically 'Wave 2' thereof, discrete communications to more than one target node at the same time may take place using what is called Multi-User (MU) MIMO capability of the WAP. MU capabilities were added to the standard to enable the WAP to transmit downlink communications to multiple stations concurrently, thereby increasing the time available for discrete MIMO video links to wireless HDTVs, computers tablets and other high throughput wireless devices. The IEEE 802.11ax standard expanded MU MIMO capabilities to include concurrent uplinks from two or more stations to the WAP.

The improvements in throughput capacity of the latest generation of wireless access points (WAP)s and stations have required more transmit and receive chains, more antennas, and more bandwidth. IEEE 802.11a/g/n transceivers may have had only a single antenna, a single transmit, and a single receive chain, and a bandwidth limited to a 20 MHz channel. An IEEE 802.11ax transceiver may have eight, antennas, eight transmit chains, eight receive chains and a bandwidth extensible up to a 160 MHz channel. All these improvements have resulted in significant increased in the power consumption of the transceiver. This power consumption coupled with the always 'On' nature of the wireless local area network (WLAN) transceivers has resulted in standard bodies insisting on limits on the energy consumption of these WAPS and stations, leaving it up to the engineers to determine how to do so.

What is needed are methods for further improvements in wireless MIMO transceivers power consumption.

SUMMARY OF THE INVENTION

The invention provides a method and apparatus for efficiently driving the power amplifiers on the transmit chains of multiple-input multiple-output (MIMO) wireless transceivers. In an embodiment of the invention a wireless MIMO transceiver apparatus for wireless communication on a wireless local area network (WLAN) is disclosed. The wireless transceiver apparatus includes: a plurality of antennas, a plurality of components forming transmit and receive chains, voltage sources, power amplifier supply voltage detectors and regulated switches. The plurality of components are coupled to one another to form transmit and receive chains coupled to the plurality of antenna for MIMO wireless communications on the WLAN. The components forming the transmit chains include: power amplifiers (PA)s each coupled at a signal input to a corresponding one of the transmit chains for amplifying radio frequency (RF) signals of a MIMO communication link and each power amplifier having a supply voltage input for powering the power amplifier. The PA supply voltage detectors are each coupled at ah input to an associated one of the transmit chains to detect changes in an amplitude of the signal on each transmit chain and to identify required changes in the supply voltage level of the corresponding PA for transmission of said signal. The regulated switches are coupled between the voltage sources and the PAs, and responsive to each PA's supply voltage detector to switchably couple the supply voltage input of each PA to the voltage sources providing the identified voltage levels during transmission of the signal.

The invention may be implemented in hardware, firmware, circuits, or software.

Associated Methods are also claimed.

BRIEF DESCRIPTION OF THE DRAWINGS

These and other features and advantages of the present invention will become more apparent to those skilled in the art from the following detailed description in conjunction with the appended drawings in which:

FIGS. 2A-2E are graphs showing various phases in the operation of the identification of discrete voltage levels required to drive the power amplifier on each transmit chain of the wireless transceiver;

FIG. 3A-B is a detailed circuit diagram and a hardware block diagram of respectively a transmit power amplifier supply voltage detector and of a transceiver incorporating same, in accordance with an embodiment of the invention;

FIG. 5 is a process flow diagram of an embodiment of the processes associated with driving the MIMO transmit power amplifiers.

DETAILED DESCRIPTION OF THE EMBODIMENTS

Figure 1:
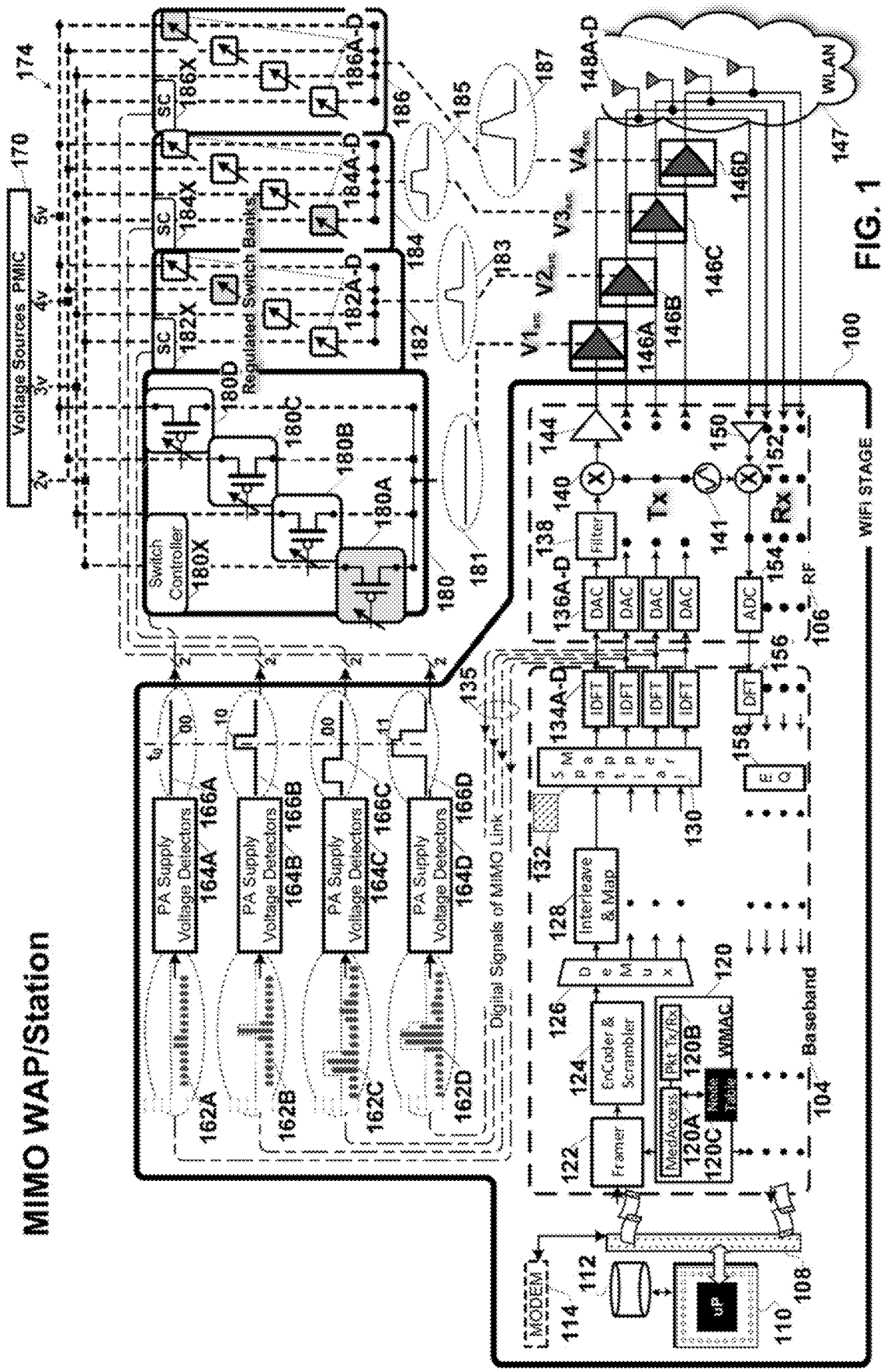
FIG. 1 is a detailed hardware block diagram a MIMO wireless transceiver with regulated switch banks for driving the transmit power amplifiers.

FIG. 1 is a detailed hardware block diagram a MIMO wireless transceiver with: a wireless stage 100, and regulated switch banks 180-186 for driving the transmit power amplifiers (PA)s 146A-D. In this embodiment of the invention the transceiver comprises discrete interconnected very large scale integrated circuits (VLSI). The VLSI chips include: a VLSI WiFi stage circuit 100 which includes the WiFi transmit and receive baseband circuit 104 and AFE/circuits 106; regulated switch bank circuits 182-186; PA circuits 146A-D; and antennas 148A-D. The wireless transceiver may be a WAP or a station. The transceiver supports wireless communications on a wireless local area network (WLAN) 147 which provides associated stations, access to the internet (not shown).

The transceiver in this embodiment of the invention is a WAP identified as a 4×4 multiple-input multiple-output (MIMO) WAP supporting as many as 4 discrete communication streams over its 4 antennas 148A-D. The transceiver couples to the Internet via an Ethernet medium access control (EMAC) interface (not shown) and modem 114 to a cable, fiber, or digital subscriber line (DSL) backbone-connection. A packet bus 108 couples the EMAC to the MIMO WiFi baseband 104, and the analog front end (AFE) and Radio Frequency (RF) stages 106.

In the baseband portion 104 wireless communications transmitted to or received from each user/client/station are processed. The baseband portion is dynamically configurable to support SU-MIMO or MU-MIMO transmission to MU groups of two or more users/stations. The AFE and RF portion 106 handles the upconversion on each of the transmit chains/paths of the wireless transmission initiated in the baseband. The RF portion also handles the downconversion of the signals received on the receive chains/paths and passes them for further processing to the baseband.

Transmission:

The transmit path/chain includes the following discrete and shared components. The WiFi medium access control (WMAC) component 120 includes: hardware queues for each downlink and uplink communication stream (not shown); encryption and decryption circuits (not shown) for encrypting and decrypting the downlink and uplink communication streams; medium access circuit 120A for making the clear channel assessment (CCA), and making exponential random backoff and re-transmission decisions; and a packet processor circuit 120B for packet processing of the communication streams. The WMAC component has a node table 120C which lists each node/station on the WLAN, the station's capabilities, the corresponding encryption key, and the priority associated with its communication traffic.

Each sounding or data packet for wireless transmission on the transmit path components to one or more stations is framed in the framer 122. Next each stream is encoded and scrambled in the encoder and scrambler 124 followed by demultiplexing in demultiplexer 126 and by interleaving and mapping in a corresponding one of the interleaver mappers 128. Next all transmissions are spatially mapped in the spatial mapper 130 with a beamforming matrix "V" 132 for transmission of user data packets subsequent to a sounding. The spatially mapped streams from the spatial mapper are input to Inverse Discrete Fourier Transform (IDFT) components 134A-D for conversion from the frequency to the time domain and subsequent transmission in the AFT and RF stage 106.

Each IDFT is coupled to a corresponding one of the transmit path/chain components in the AFE/RF stage 106. Specifically, each IDFT couples to an associated one of the digital-to-analog converters (DAC) 136A-D for converting the digital transmission to analog. The analog signals output by each chain's DAC are then filtered in filters 138 and passed to upconverters 140, which are each coupled to a common channel frequency voltage controlled oscillator (VCO) 141 for upconverting the transmission to the appropriate center frequency of the selected channel(s). The upconverted radio frequency (RF) signals on each transmit chain are then subject to cm chip amplification in low voltage power amplifiers 144. Next, the RF signal on each chain is subject to another round of amplification in power amplifier circuits 146A-D the outputs of which couple to the antennas 148A-D.

To minimize the power consumed by the power amplifiers 146A-D their supply voltage inputs are each coupled via a corresponding one of the regulated switch banks 182-186 to distinct voltage sources e.g. 2v, 3v, 4v, 5v, provided by Power Management Integrated Circuit (PMIC) 170. Each regulated switch bank is coupled to each of the distinct voltage sources, e.g. 2V, 3V, 4V and 5V provided by the PMIC 170 via a corresponding one of rails 174. The switch bank's sequence of switch states determines for each transmit chain's power amplifier what the supply voltage level will be for each power amplifier and when along the timeline of each RF signal the breakpoints from one voltage to another will take place. This decision in turn is based on the timeline of the amplitude variations of the transmitted signal on each chain, as detected at the output of each IDFT 134A-D in which the signal on each chain has been transformed to the time domain but is still in digital form.

The processing begins with the monitoring of the digital signals 135 on each transmit chain at the output of the IDFTs 134A-D. Representative signals 162A-D on each chain are shown. The PA supply voltage detectors 164A-D coupled to each transmit chain monitor these signals and determine the optimal breakpoints in the timeline of the signal on each chain for transitioning to a higher or lower voltage level. The limited number of voltage levels, conforms to the number of distinct voltage sources 170 provided by the power management integrated circuit (PMIC) 170. Each PA supply, voltage detector 164A-D outputs, a corresponding switch state signal 166A-D which indicates the sequence in which each of the PMIC's voltage sources are to be coupled to the corresponding PA's supply voltage input to minimize the power consumption of each PA without corrupting the transmitted signal on each antenna. In the example shown a 2bit switch state signal 166A-D is output by each PA supply voltage detector to the corresponding one of the regulated switch banks 180-186. The switch state signals from PA supply voltage detectors 164A-D are each input to a respective one of the regulated switch banks 180-186 and specifically the switch controllers 180X-186X respectively thereof. The switch controller in each switch bank controls the regulated switches in each bank. The regulated switches reduce the spikes associated with switching from one voltage source to another. Four regulated switches 180A-D coupled to switch controller 180X are shown in regulated switch bank 180 switchably coupling the PMIC voltage sources to PA 146A of the $1^{st}$ transmit chain. Four regulated switches 182A-D coupled to switch controller 182X are shown in regulated switch bank 182 switchably coupling the PMIC voltage sources to PA 1468 of the $2^{nd}$ transmit chain. Four regulated switches 164A-D coupled to switch controller 184X are shown in regulated switch bank 184 switchably coupling the PMIC voltage sources to PA 146C of the $3^{rd}$ transmit chain. Four regulated switches 186A-D coupled to switch controller 186X are shown in regulated switch bank 186 switchably coupling the PMIC voltage sources to PA 146D of the $1^{st}$ transmit chain. The regulated switches in each switch bank 180, 182, 184, 186 output regulated voltage source supply signals 181, 183, 185, 187 respectively to drive the supply voltage inputs of the corresponding ones of power amplifiers 146A-D.

In an embodiment of the invention the PA supply voltage detectors are instantiated by processor circuit 110 running program code in non-volatile storage 112. In another embodiment of the invention the regulated switch banks are each incorporated into a single VLSI chip with the PA's. In another embodiment of the invention the power amplifiers, regulated switch banks and WiFi stage are all incorporated on a single chip.

Reception:

The receive path/chain includes the following discrete and shared components. Received communications on the transceiver's array of MIMO antenna are subject to RF processing including downconversion in the AFE-RF stage 106. There are four receive paths each including the following discrete and shared components: low noise amplifiers (LNA) 150 for amplifying the received signal, downconverters 152 coupled to the VCO 141 for downconverting the received signals, filters (not shown), and analog-to-digital converters (ADC) 154 for digitizing the downconverted signals. The digital output from each ADC is passed to a corresponding one of the discrete Fourier transform (DFT) components 156 on each chain in the baseband portion 104 of the WiFi stage for conversion from the time to the frequency domain.

Receive processing in the baseband stage includes the following shared and discrete components: an equalizer 158 to mitigate channel impairments which is coupled to the output of the DFTs 156. The received streams at the output of the equalizer are subject to demapping and deinterleaving in a corresponding number of the demapper/deinterleavers (not shown). Next the received stream(s) are decoded and descrambled in the decoder and descrambler component (not shown), followed by de-framing in the deframer (not shown). The received communication is then passed to the WMAC component 120 where it is placed in the appropriate upstream hardware queue for upload to the Internet.

FIGS. 2A-2E are graphs showing various phases in the operation of the identification of discrete voltage levels required to drive the power amplifier on each transmit chain of the wireless transceiver. FIG. 2A is a graph 200 of the performance characteristics for one of the power amplifiers 146D shown in FIG. 1. The power amplifier 146D is shown with a supply voltage input 202 for coupling to a voltage source $V_{scr}$. The power amplifier accepts a signal 204A at its signal input 205A and outputs the amplified signal 204B at its signal output 205B. The graph 200 has left and right "Y" axis showing PA load current $I_L$ and PA source voltage $V_{src}$, and an "X" axis showing PA output power. The graph shows the comparative current draw when the PA supply voltage input is coupled to a fixed voltage source on line 206A, and when the PA the PA supply voltage input is switchably coupled to any one of four different voltage sources on line 206B. The voltage levels 208A-D may be determined on the basis of the performance characteristics of the PAs. The current draw and hence power consumption of the PA for the ease in which the supply voltage input is switchably coupled to the appropriate one of the voltage sources is significantly less than when the supply voltage input is coupled to a fixed voltage source.

FIGS. 2B-2E are graphs showing the processes performed by the PA supply voltage detector on each transmit chain of the transceiver. FIG. 2B is a graph showing a signal 162D (see FIG. 1) on one of the transceiver's transmit chains at a point in the transmit path processing where it is in the time domain and still in digital form, e.g. at the output of the corresponding IDFT 1340 (See FIG. 1). FIG. 2G is a graph showing the signal (1620) after normalization. This normalized signal 222 exhibits a peak amplitude 228 in a sliding window 224 along its timeline which in an embodiment of the invention falls just below the highest of the voltage levels, Vsrc max, provided by the PMIC voltage sources, e.g. 5V. Normalization is performed on the signal on each transmit chain independently of one another, since at any point in time the signals being processed may differ from one another. In an embodiment of the invention the maximum voltage level to which the signals on each transmit chain are normalized is determined independently for each link. For example, a communication link to a station in another room might be normalized to a maximum voltage level higher than would a communication link to another station on the WLAN that was in the same room as the WAP.

FIG. 2D is a graph showing the identification along the timeline of the normalized signal of the breakpoints in the supply voltage levels required at the supply voltage input 202 of the PA and of the corresponding voltage levels on either side of each breakpoint. Rising and falling breakpoints 230A-E are shown. At breakpoint 230A the amplitude of the normalized signal breaks through the 3v floor, thereby requiring a step up in the level of the voltage provided at the supply voltage input of the PA to 4v. FIG. 2E shows a representative switch bank control signal 240 output by the PA supply voltage detector in response to the breakpoints identified in the prior figure. The signal identifies the timing and voltage levels required for driving the supply voltage input 202 of the PA during the portion of the timeline of the transmitted signal shown in FIGS. 2B-2E.

FIG. 3A-B is a detailed circuit diagram and a hardware block, diagram of respectively a transmit power amplifier supply voltage detector and of a transceiver incorporating same, in accordance with an embodiment of the invention. FIG. 3A is a detailed circuit diagram of a transmit power amplifier supply voltage detector circuit 164D instantiated on a processor circuit 110. A sliding window buffer 300 accepts input of the digital signal 162D being processed on a corresponding one of the transmit chains. A peak detector 302 coupled to the sliding window buffer, detects the peaks in the signal in the sliding window buffer and passes that to the normalization coefficient determination circuit 304 in which the coefficient required to normalize the detected peak(s) to the maximum voltage level for the link is determined. That coefficient is passed to the multiplier 306 for multiplication with the signal output by the sliding window buffer. The normalized signal is then passed to the digital breakpoint identification circuit 308 in which the breakpoints and corresponding voltage levels before and after each breakpoint are determined and passed to the switch control signal generator 310. The switch control signal generator circuit generates a binary control signal 166D or a sequence of bits corresponding to same for controlling the corresponding regulated switchbank, e.g. switchbank 186, as shown in FIG. 1. In the example shown where the PMIC supplies 4 distinct voltage sources the switch control signal is a 2bit signal line with the sequence of bits identifying the sequence of voltage source to be coupled to the supply voltage input of the corresponding PA.

FIG. 3B is a hardware block diagram of respectively a transmit power amplifier supply voltage detector and of a transceiver incorporating same, in accordance with an embodiment of the invention. In this embodiment of the invention a link power circuit 330 determines the maximum voltage level to be applied to the supply voltage inputs of all PAs for each distinct downlink. For example, downlink 350A to wireless computer station 350 may bb allocated a different power level than downlink 352A to wireless notebook computer station 352. In this embodiment of the invention the link poorer circuit 330 is instantiated on processor 110 running program code 112B stored in non-volatile memory 112. The link parameter circuit harvests link specific information from the WiFi state including: modulation coding schema (MCS), packet error rate (PER), Received signal strength Indicia (RSSI), etc. Similarly, the airtime circuit 330B harvests individual and overall airtime requirements for each link from the WiFi stage. The link power circuit stores these parameters 112A In memory 112. The link parameters and airtime requirements are passed to the per link power determination circuit 330C which determines the power requirements of each link. High traffic links with a distant station, may be assigned a higher power level than that assigned to a proximate station with low traffic requirements. The link, power circuit passes the corresponding PA supply voltage maximums for each link to the PA supply voltage detectors, which uses those maximums in normalizing the signals on each transmit chain.

Figure 4B:
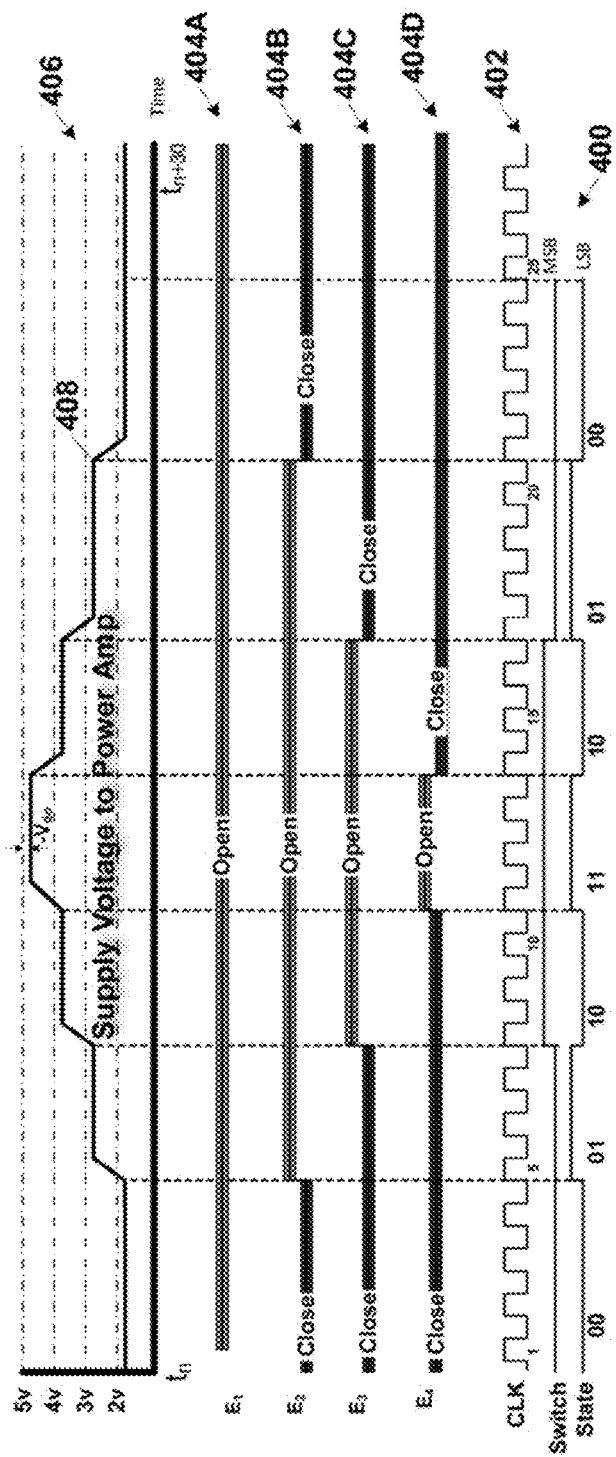
FIG. 4A-B are a circuit diagram and a supply voltage switch timing diagram of a low-dropout regulated switch bank in accordance with an embodiment of the invention.
Figure 4A:
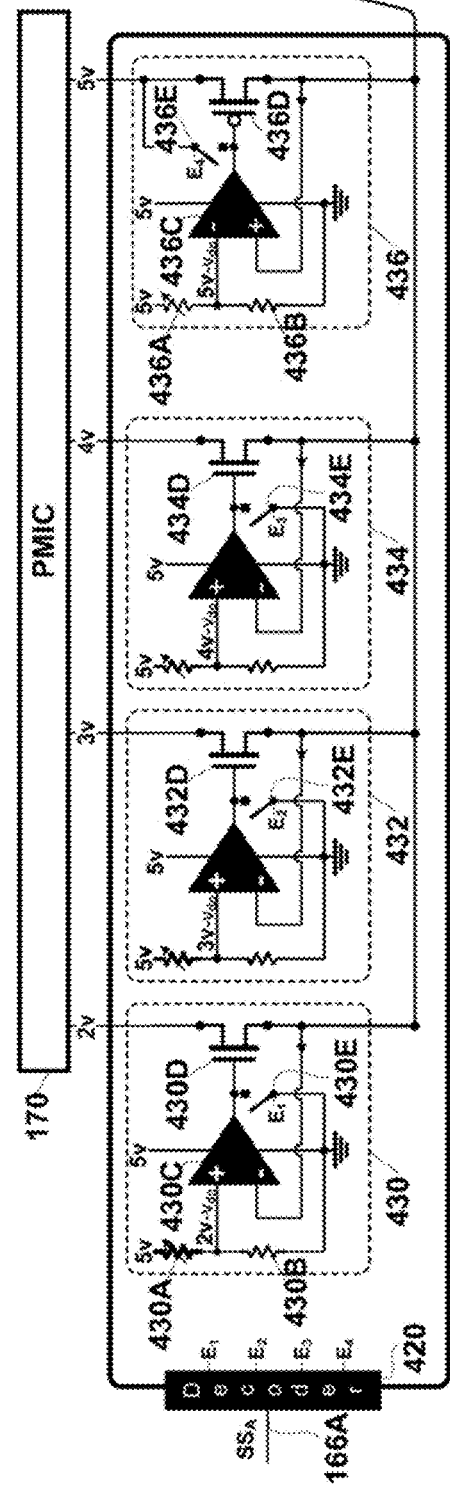

FIG. 4A-B are a circuit diagram and a supply voltage switch timing diagram of a low-dropout (LDO) regulated switch bank in accordance with an embodiment of the invention. The decoder 420 at the input of the switch bank serves as tire switch controller (180X see FIG. 1) for the switch bank by accepting input of the 2bit switch state signal 166A from the corresponding one of the PA supply voltage detectors, i.e. supply voltage detector 164A (see FIG. 1), and outputting four enable signals $E_{1-4}$ to enable or disable a corresponding one of the four LDO regulators 430, 432, 434, 436. Each LDO regulator couples a corresponding one of the distinct voltage sources, e.g. 2v, 3v, 4v, 5v, provided by the PMIC 170 to the supply voltage input of the corresponding PA, i.e. PA 146A. LDO regulator 430 couples the PA to the 2v source provided by PMIC 170. That regulator includes an NMOS transistor 430D with the source-drain channel coupling the 2V voltage source of the PMIC to the supply voltage input of the PA 146A. The gate of transistor 430D is coupled to the output of op-amp 430O. The output of the op amp vanes the voltage on the gate to maintain a constant voltage at the drain of transistor 430D. This regulation is accomplished via coupling the negative input of the op amp to the drain of the NMOS transistor and the positive input of the op amp to the common node of the resistor ladder formed by variable resistor 430A and fixed resistor 430B. The common node between resistors 430A-B is shown having a voltage of 2V-Vdo where $V_{do}$ is the dropout voltage, typically between 0.1 and 0.7 volts. Variable resistor 430A is used adjust the dropout voltage to vary the amount of isolation of the PA supply voltage input from variations/ripples in the 2v source supplied by the PMIC. The LDO is enabled or disabled via switch 430E which switchably couples or uncouples the gate of the NMOS transistor 430E to ground. When the LDO regulator is operative the switch 430E is open, and when the switch is closed the gate of the NMOS transistor is pulled to ground therefore closing the drain-source channel and uncoupling the supply Voltage input 202 of PA 146A from the 2V source. Similar voltage regulation circuitry is shown for the 3v and 4v LDO regulators 432-434. The circuit for the LDO regulator 436 coupled to the highest voltage source, e.g. 5v, provided by the PMIC has similar circuitry as the LDOs which regulate the lower voltage sources with several exceptions. First, the transistor 436D is PMOS, second the enable switch 436E switchably couples the gate of the transistor to the 5v source provided by the PMIC 170, and third the feedback from the drain of transistor 436D is coupled to the positive op-amp Input, and the common node of the resistor ladder 436A-B is coupled to the negative input of the op-amp. The LDO regulator 436 is enabled or disabled via switch 436E which switchably couples or uncouples the gate of the PMOS transistor 436D to the 5V source of the LDO regulator. When the LDO regulator is operative the switch 436E is open, and when the switch is closed the gate of the PMOS transistor is pulled up to 5v therefore closing the drain-source channel and uncoupling the PA from the 5V source. The regulated voltage provided by the LDO switch bank 180 is coupled in parallel to the supply voltage input 202 of the PA 146A and to capacitor 438.

FIG. 4B shows a supply voltage switch timing diagram of the low-dropout (LDO) regulated switch bank 180 in accordance with an embodiment of the invention. The most and least significant bits of the 2bit switch state signal 400 is shown along with the system dock signal 402. The switch state signal 400 supplied by the corresponding PA supply voltage detector 164A shows four different values each corresponding with a distinct one of the four voltage levels provided by the PMIC to be delivered to the supply voltage input of the corresponding PA. The LDO switch signals $E_{1-4}$ 404A-D respectively, each place their corresponding LDO 430-436 into either the operative state or the inoperative state. An LDO becomes inoperative when the corresponding one of enable switches 430E, 432E, 434E, 436E is 'Closed'. Conversely, an LDO becomes operative when the corresponding one of the enable switches 430E, 432E, 434E, 436E is 'Open'. Each LDO is operative, i.e. its enable switch is 'Open', whenever the required PA voltage level called for by the switch state signal 400 is at or above the level of the PMIC voltage source to which that LDO is coupled. Conversely any of the LDO is rendered inoperative, i.e. its enable switch is 'Closed', whenever the required PA voltage level called for by the switch state signal 406 is below the level of the PMIC voltage source to which that LDO is coupled. The LDOs operate in series to provide voltage to the PA'S supply voltage input. Thus, as the Voltage level is increased, the LDO providing the current voltage level, gently decreases its contribution to the voltage provided to the PA supply input as the contribution from the neighboring LDO coupled to toe next higher voltage source comes online. Graph 406 shows the resultant PA supply voltage levels 408 provided by the LDO regulated switch bank in response to the switch state signal 400. The resultant sequence of PA supply voltage levels 408 exhibit smooth transitions with controllable transition slopes between one voltage level in the sequence and the next.

Figure 4D:
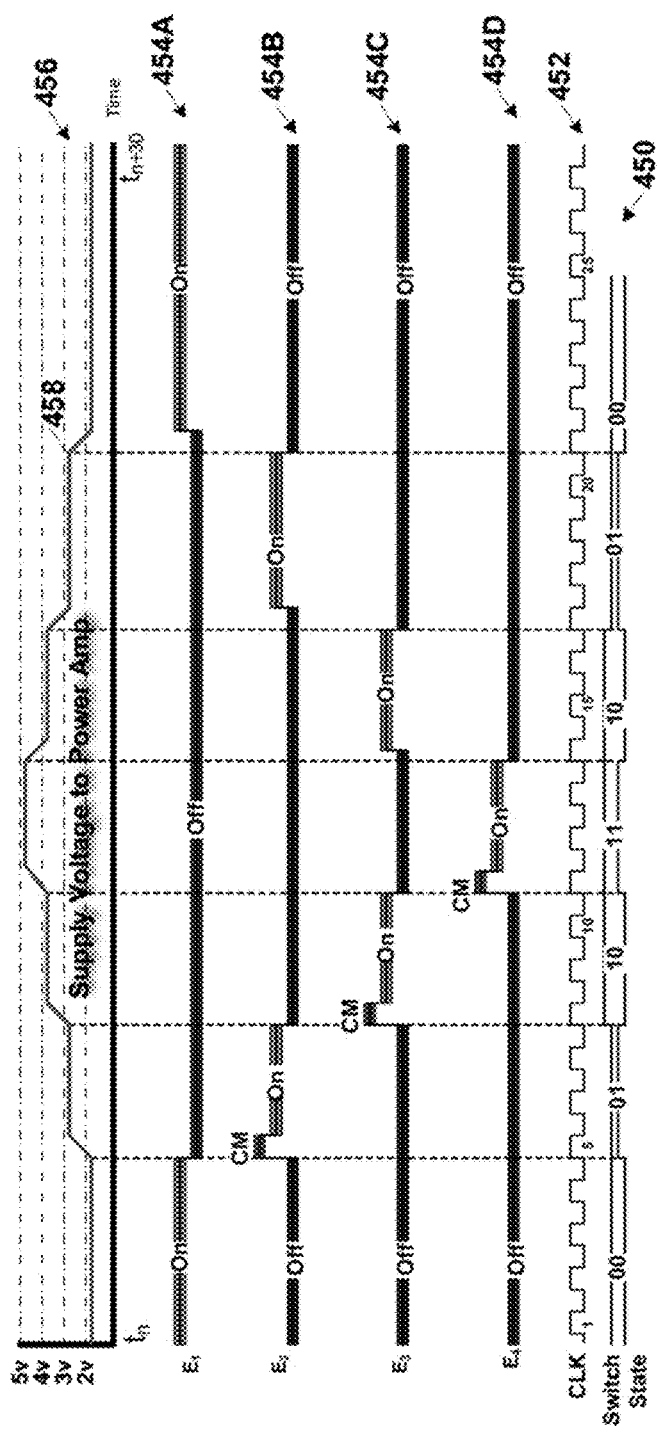
FIG. 4C-D are a circuit diagram and switch supply voltage timing diagram of a current mirror regulated switch bank in accordance with another embodiment of the invention.
Figure 4C:
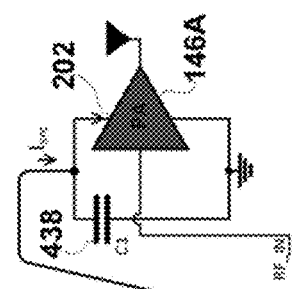
Figure 4C:
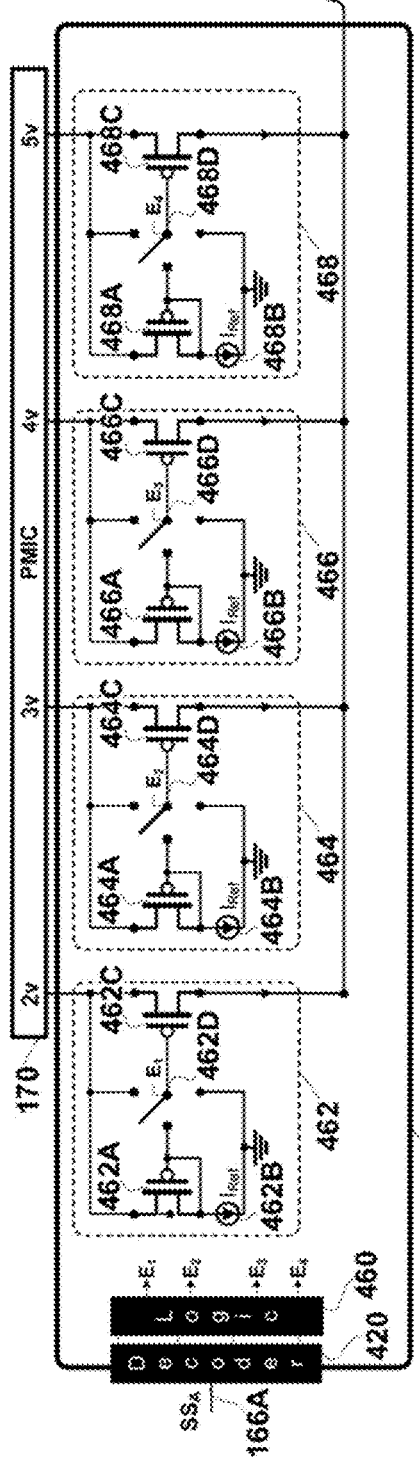

FIG. 4C-D are a circuit diagram and switch supply voltage timing diagram of a current mirror regulated switch bank in accordance with another embodiment of the invention. A representative one of the regulated switch banks is shown, i.e. regulated switch bank 180. The decoder 420 and logic 460 collectively serve as the switch controller (180X see FIG. 1) for switch bank 180 by accepting input of the 2bit switch state signal 166A from the corresponding one of the PA supply voltage detectors, i.e. supply voltage detector 164A (see FIG. 1), and outputting four enable signals $E_{1-4}$ to place the corresponding one of the four LDO regulators 430, 432, 434, 436 in one of 3 states; i.e. 1) Current Mirror Enabled a.k.a. "CM", 2) Mirror Leg transistor Enabled but without gate-to-gate connection to reference leg a.k.a. "On", and 3) Mirror Leg Transistor disabled a.k.a. "Off". Each current mirror regulator couples a corresponding one of the distinct voltage sources, e.g. 2v, 3v, 4v, 5v, provided by the PMIC 170 to the supply voltage input of the corresponding PA, i.e. PA 146A. Current mirror regulator 462 couples the PA to the 2v source provided by PMIC 170. That regulator includes a pair of PMOS transistors 462A, 462C coupled in parallel between the PMIC's 2v source and an electrical ground and located respectively on the reference and mirror legs of the current mirror regulator 462. The reference leg also includes a reference current source 462B coupled serially between the drain of the reference transistor 462A and an electrical ground. A single pole triple throw (SPTT) enable switch 462D couples the gate of the mirror leg transistor 462C to either: 1) The gate of the reference leg transistor in the CM switch state; 2) The electrical ground in the On switch state; or 3) the 2V source in the Off switch state. Similar voltage regulation circuitry is shown for the 3v, 4v, and 5v current mirror regulators 464-468. Current mirror regulator 464 couples the PA to the PMIC's 3v source and includes a pair of PMOS transistors 462A, 462C coupled in parallel between the PMIC's 3v source and an electrical ground and located respectively on the reference and mirror legs of the current mirror regulator 464. The reference leg also includes a reference current source 464B coupled serially between the drain of the reference transistor 462A and an electrical ground. A single pole triple throw (SPTT) enable switch 464D couples the gate of the mirror leg transistor 462C to either: 1) The gate of the reference leg transistor in the CM switch state; 2) the electrical ground in the On switch state; or 3) the 3V source in the Off switch state. Current mirror regulator 466 couples the PA to the PMIC's 4v source and includes a pair of PMOS transistors 466A, 466C coupled in parallel between the PMIC's 4v source and an electrical ground and located respectively on the reference and mirror legs of the current mirror regulator 466. The reference leg also includes a reference current source 466B coupled serially between the drain of the reference transistor 466A and an electrical ground. A single pole triple throw (SPTT) enable switch 466D couples the gate of the mirror leg transistor 466C to either: 1) The gate of the reference leg transistor in the CM switch state; 2) the electrical ground to the On switch state; or 3) the 4V source in the Off switch state. Current mirror regulator 468 couples the PA to the PMIC's 5v source and includes a pair of PMOS transistors 468A, 468C coupled in parallel between the PMIC's 5v source and an electrical ground and located respectively on the reference and mirror legs of the current mirror regulator 468. The reference leg also includes a reference current source 468B coupled serially between the drain of the reference transistor 468A and an electrical ground. A single pole triple throw (SPTT) enable switch 468D couples the gate of the mirror leg transistor 468C to either: 1) The gate of the reference leg transistor in the CM switch state; 2) the electrical ground in the On switch state; or 3) the 5V source in the Off switch state. The regulated voltage provided by the current mirror switch bank 180 is coupled in parallel to the supply voltage input 202 of the PA 146A and to capacitor 438.

FIG. 4D shows a supply voltage switch timing diagram of the current mirror regulated switch bank 180 in accordance with another embodiment of the invention. The most and least significant bits of the 2bit switch state signal 450 is shown along with the system dock signal 452. The switch state signal 450 supplied by the corresponding PA supply voltage detector 164A shows four different values each corresponding with a distinct one of the four voltage levels provided by the PMIC to be delivered to the supply voltage input of the corresponding PA. The current mirror switch signals $E_{1-4}$ 454A-D respectively, each place their corresponding current mirror 462-468 into one of three stitch states, i.e. either one of the two operative states CM or On, or the inoperative state Off. The current mirrors operate in series to provide voltage to the PA's supply voltage input. Graph 456 shows the resultant PA supply voltage levels 458 provided by the current mirror regulated switch bank in response to the switch state signal 450. The resultant sequence of PA supply voltage levels 458 exhibit smooth transitions with controllable transition slopes between one voltage level in the sequence and the next.

In an embodiment of the invention additional circuitry may be added to each current mirror to increase the accuracy of the transition between the switch states. For example, a Schmidt trigger across the drain source nodes of the mirror leg transistor can be used to provide feedback to the logic 460 which triggers a change in the corresponding current mirror switch signal from the CM to the On state.

FIG. 5 is a process flow diagram of an embodiment of the processes associated with driving the MIMO transmit power amplifiers. In process 500 RF Power Amplifiers (PA)s are provided, with each PA coupled to a corresponding one of the MIMO transmit (TX) chains of the Wireless Transceiver. Each PA has: a supply voltage input, a signal input, and a signal output. Voltage sources each having a distinct voltage for powering the power amplifiers are provided in process 502. Then in process 504 each of the power amplifiers is switchably coupled to the voltage sources. Decision process 506 initiates the optimization of PA power consumption for the next communication link handled by the subject transceiver, e.g. WAP or station. Control is passed to optional process 508 in which any link specific transmit power requirements are determined. In the case of a WAP its communication links to proximate stations may be able to operate at lower power levels than the links to more distant stations. Thus, in process 508 a maximum supply voltage level would be established for the subject link, and that supply voltage level maximum, may be less than the maximum voltage level provided in process 502. Next control is passed to the block of processes 520.

The block of processes 520 handles the generation of a distinct digital switch state signal for each transmit chain. In process 522 the digital communications signal in the time domain on each TX chain of the subject communication link is monitored. Then in process 526 the digital communication signal monitored on each TX Chain is normalized to the optimal maximum supply voltage determined for all chains of this link. Next in process 528 breakpoints are determined for the normalized digital communication signal on each TX chain independently of one another, where the breakpoints identify with respect to the timeline of the monitored signal on each chain the required transitions from one voltage source to another. Then in process 530 a distinct digital switch state signal is generated for each of the TX chains based on the breakpoints determined for that chain. Control is then passed to the block of processes 540.

Next, in the block of process 540 the transmission of the communication link including the distinct signal on each transmit chain is affected with independent switched selection of the sequence of supply voltage sources to the supply voltage input of the PA on each transmit chain. In process 542 the supply voltage input for each transmit chain's power amplifier is switchably transitioned from one source voltage to another in response to the digital switch state signal for that transmit chain, wherein the PA supply voltage input for each transmit chain is independently maintained at optimal voltage level for efficient operation of that chain. Next in process 544 at least one of current or voltage from each voltage source is regulated independent of the load on each power amplifier, during at least a portion of the interval of time associated with a switchable connection to each of the voltage sources.

The components and processes disclosed herein may be implemented a software, hardware, firmware, or a combination thereof including program code software, a memory element for storing the program code software and a hardware processor including registers, logic, and transistor gates for executing the program code software, without departing from the scope of the claimed invention.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A wireless multiple-input multiple-output (MIMO) transceiver apparatus for wireless communication on a wireless local area network (WLAN), and the wireless transceiver apparatus comprising:
   a plurality of antennas;
   a plurality of components coupled to one another to form transmit and receive chains coupled to the plurality of antenna for MIMO wireless communications on the WLAN; and the plurality of components forming the transmit chains including;
   power amplifiers (PA)s each coupled at a signal input to a corresponding one of the transmit chains for amplifying radio frequency (RF) signals of a MIMO communication link and each power amplifier having a supply voltage input for powering the power amplifier;
   voltage sources having distinct voltage levels;
   PA supply voltage detectors each coupled at an input to an associated one of the transmit chains to detect changes in an amplitude of the signal on each transmit chain and to identify required changes in the supply voltage level of the corresponding PA for transmission of said signal the PA supply voltage detectors each further responsive to the corresponding signal to normalize said signal to a link specific maximum supply voltage level prior to identifying the required changes in the supply voltage level of the corresponding PA; and
   regulated switches coupled between the voltage sources and the PAs, and responsive to each PA's supply voltage detector to switchably couple the supply voltage input of each PA to the voltage sources providing the identified voltage levels during transmission of the RF signal.

2. The wireless MIMO transceiver apparatus of claim 1, wherein the switches further comprise:
   low dropout voltage regulators (LDO)s each coupling each voltage sources to the supply voltage input of each PA and switchably operative in an 'On' switch state to regulate the identified supply voltage level to the PA from a corresponding one of the voltage sources independent of the load on the PA, and in an 'Off' switch state to disconnect the corresponding voltage source from the PA.

3. The wireless MIMO transceiver apparatus of claim 1, wherein the switches further comprise:
   low dropout voltage regulators (LDO)s each coupling each voltage source to the supply voltage input of each PA and switchably operative in an 'On' switch state to regulate the identified supply voltage level to the PA from a corresponding one of the voltage sources and in an 'Off' switch state to disconnect the corresponding voltage source from the PA, and each LDO having an adjustable dropout range to vary the amount of isolation between the corresponding voltage source and the regulated output voltage provided by the LDO.

4. The wireless MIMO transceiver apparatus of claim 1, wherein the switches further comprise:
   current mirrors (CM)s each coupling each voltage source to the supply voltage input of each PA and switchably operative in an 'On' switch state to regulate current to the PA from the corresponding one of the voltage sources supplying the identified supply voltage level and in an 'Off' state to disconnect the corresponding voltage source from the PA.

5. The wireless MIMO transceiver apparatus of claim 1, wherein the switches further comprise:
   current mirrors (CM)s each coupling each voltage source to the supply voltage input of each PA and switchably operative in an 'Oncm' switch state to regulate current to the PA from the corresponding one of the voltage sources supplying the identified supply voltage level, and in an 'On' state to avoid regulation of the current to the PA from the corresponding one of the voltage sources, and in an 'Off' state to disconnect the corresponding voltage source from the PA.

6. The wireless MIMO transceiver apparatus of claim 1, further comprising:
   a link power regulator circuit to determine a maximum supply voltage level for each MIMO communication link between the wireless MIMO transceiver apparatus and other wireless transceivers on the WLAN, based on distinct communication parameters of each link.

7. The wireless MIMO transceiver apparatus of claim 1, further comprising:
   the voltage sources having distinct programmable voltage levels determined based on operational characteristics of the PAs.

8. The wireless MIMO transceiver apparatus of claim 1, operative as one of: a Wireless Access Point (WAP) transceiver or a station transceiver.

9. A method for operating a multiple-input multiple-output (MIMO) wireless transceiver having multiple transmit chains each including a corresponding power amplifier (PA) for amplifying radio frequency (RF) signals of a MIMO communication link, and the method comprising the acts of:

providing voltage sources having distinct voltage levels;

detecting changes in an amplitude of the signal on each transmit chain;

normalizing the signal on each transmit chain to a maximum supply voltage level identified for the MIMO communication link;

identifying required changes in the supply voltage level of the corresponding PA for transmission of said signal responsive to the detected changes in each chain's signal; and switchably coupling the supply voltage input of each PA to the voltage sources providing the voltage levels identified in the identifying act during transmission of the signal on each chain.

10. The method for operating the MIMO wireless transceiver of claim 9, wherein the switchable coupling act further comprises:

regulating the identified supply voltage level to the PA from a corresponding one of the voltage sources independent of the load on the PA in an 'On' switch state; and disconnecting the corresponding voltage source from the PA in an 'Off' switch state.

11. The method for operating the MIMO wireless transceiver of claim 9, wherein the switchable coupling act further comprises:

regulating the identified supply voltage level to the PA from a corresponding one of the voltage sources in an 'On' switch state, including;

adjusting a dropout voltage range to vary the amount of isolation between the corresponding voltage source and the regulated output voltage provided by the LDO; and disconnecting the corresponding voltage source from the PA in an 'Off' switch state.

12. The method for operating the MIMO wireless transceiver of claim 9, wherein the switchable coupling act further comprises:

regulating current to the PA from the corresponding one of the voltage sources supplying the identified supply voltage level in an 'On' switch state; and disconnecting the corresponding voltage source from the PA in an 'Off' switch state.

13. The method for operating the MIMO wireless transceiver of claim 9, wherein the switchable coupling act further comprises:

regulating current to the PA from the corresponding one of the voltage sources supplying the identified supply voltage level in an in an 'Oncm' switch state;

avoiding regulation of the current to the PA from the corresponding one of the voltage sources in an 'On' switch state; and disconnecting the corresponding voltage source from the PA in an 'Off' switch state.

14. The method for operating the MIMO wireless transceiver of claim 9, wherein the identifying act further comprises:

determining a maximum supply voltage level for each MIMO communication link between the wireless MIMO transceiver and other wireless transceivers on the WLAN, based on distinct communication parameters of each link.

15. The method for operating the MIMO wireless transceiver of claim 9, wherein the providing act further comprises:

determining the distinct voltage levels for the provided voltage sources based on operational characteristics of the power amplifiers.

16. The method for operating the MIMO wireless transceiver of claim 9, wherein the act of switchably coupling further comprises:

switchably toggling a supply voltage input of the corresponding PA from one provided voltage source to another, wherein the PA supply voltage input for each TX Chain is independently maintained at optimal voltage level for efficient operation of that Chain.

17. The method for operating the MIMO wireless transceiver of claim 9, further comprising one of the acts of:

operating the MIMO wireless transceiver as a Wireless Access Point (WAP) transceiver; or operating the MIMO wireless transceiver as wireless station transceiver.

18. A transceiver apparatus for wireless communication, and the transceiver apparatus comprising:

a plurality of antennas;

a plurality of components coupled to one another to form transmit and receive chains coupled to the plurality of antenna for wireless communications; and the plurality of components forming the transmit chains including:

power amplifiers (PA)s each coupled at a signal input to a corresponding one of the transmit chains for amplifying radio frequency (RF) signals of a wireless communication link and each power amplifier having a supply voltage input for powering the power amplifier;

voltage sources having distinct voltage levels;

PA supply voltage detectors each coupled at an input to an associated one of the transmit chains to detect changes in an amplitude of the signal on each transmit chain, each of the PA supply voltage detectors is further configured to normalize said signal to a per link supply voltage level, and to identify changes in the supply voltage level of the corresponding PA for transmission of said signal; and regulated switches coupled between the voltage sources and the PAs, and responsive to each PA's supply voltage detector to switchably couple the supply voltage input of each PA to the voltage sources providing the identified voltage levels.

19. The apparatus of claim 18, wherein the switches further comprise:

low dropout voltage regulators (LDO)s each coupling each voltage sources to the supply voltage input of each PA and switchably operative in an 'On' switch state to regulate the identified supply voltage level to the PA from a corresponding one of the voltage sources independent of the load on the PA, and in an 'Off' switch state to disconnect the corresponding voltage source from the PA.

20. The apparatus of claim 18, wherein the switches further comprise:

current mirrors (CM)s each coupling each voltage source to the supply voltage input of each PA and switchably operative in an 'On' switch state to regulate current to the PA from the corresponding one of the voltage sources supplying the identified supply voltage level and in an 'Off' state to disconnect the corresponding voltage source from the PA.

* * * * *